(12) United States Patent
Wang et al.

(10) Patent No.: US 10,513,414 B2
(45) Date of Patent: Dec. 24, 2019

(54) SYSTEM AND METHOD OF MAINTAINING PERFORMANCE OF A SYSTEM

(71) Applicant: Otis Elevator Company, Farmington, CT (US)

(72) Inventors: Yang Wang, East Hartford, CT (US); HanJong Kim, Farmington, CT (US); Christopher S. Czerwinski, Farmington, CT (US); Edward Piedra, Farmington, CT (US); Shashank Krishnamurthy, East Hartford, CT (US); Draguna Vrabie, East Hartford, CT (US); Rui Huang, East Hartford, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 229 days.

(21) Appl. No.: 15/541,007

(22) PCT Filed: Dec. 17, 2015

(86) PCT No.: PCT/US2015/066351
§ 371 (c)(1),
(2) Date: Jun. 29, 2017

(87) PCT Pub. No.: WO2016/109231
PCT Pub. Date: Jul. 7, 2016

(65) Prior Publication Data
US 2018/0257907 A1    Sep. 13, 2018

Related U.S. Application Data

(60) Provisional application No. 62/097,378, filed on Dec. 29, 2014.

(51) Int. Cl.
*B66B 1/34* (2006.01)
*G01R 31/34* (2006.01)
(Continued)

(52) U.S. Cl.
CPC ............. *B66B 1/3407* (2013.01); *B66B 5/14* (2013.01); *G01R 31/343* (2013.01); *G01R 31/40* (2013.01)

(58) Field of Classification Search
CPC .............................. B66B 1/3407; G01R 31/40
(Continued)

(56) References Cited

U.S. PATENT DOCUMENTS

| 4,438,831 A | 3/1984 | Rohanna |
| 5,817,994 A * | 10/1998 | Fried ........................ B66B 1/34 187/391 |

(Continued)

FOREIGN PATENT DOCUMENTS

| CN | 1221251 A | 6/1999 |
| CN | 102471013 A | 5/2012 |

(Continued)

OTHER PUBLICATIONS

Chinese First Office Action for application CN 20150072933.4, dated Nov. 14, 2018, 11 pages.

(Continued)

Primary Examiner — David Luo
(74) Attorney, Agent, or Firm — Cantor Colburn LLP

(57) ABSTRACT

A system including a drive portion, and an external computing device in communication with the drive portion, wherein the external computing device is configured to receive operational data from the drive portion, determine operational parameters based at least in part on the operational data, determine whether the operational parameters are valid, and automatically transmit commands to the drive portion if the operational parameters are valid.

17 Claims, 2 Drawing Sheets

(51) Int. Cl.
  *G01R 31/40* (2014.01)
  *B66B 5/14* (2006.01)

(58) Field of Classification Search
  USPC ...................................................... 318/3, 34
  See application file for complete search history.

(56) References Cited

U.S. PATENT DOCUMENTS

| | | | |
|---|---|---|---|
| 6,795,798 | B2 | 9/2004 | Eryurek et al. |
| 6,907,375 | B2 | 6/2005 | Guggari et al. |
| 7,002,462 | B2 | 2/2006 | Welch |
| 7,073,633 | B2 * | 7/2006 | Weinberger ............ B66B 5/0025 187/247 |
| 7,314,117 | B2 * | 1/2008 | Finschi ..................... B66B 1/34 187/247 |
| 7,398,860 | B2 | 7/2008 | Amano |
| 7,448,473 | B2 | 11/2008 | Lindberg et al. |
| 8,028,807 | B2 | 10/2011 | Deplazes et al. |
| 8,069,958 | B2 | 12/2011 | Lence-Barreiro |
| 2008/0116017 | A1 | 5/2008 | Kress |
| 2012/0051449 | A1 | 3/2012 | Bunter et al. |
| 2012/0175196 | A1 | 7/2012 | Hughes et al. |

FOREIGN PATENT DOCUMENTS

| | | |
|---|---|---|
| EP | 0477967 A2 | 4/1992 |
| JP | 6-156965 | 6/1994 |
| JP | 2007131407 A | 5/2007 |
| JP | 2013063825 A | 4/2013 |
| WO | 02064479 A1 | 8/2002 |
| WO | 2011073212 A1 | 6/2011 |
| WO | 2014068194 A1 | 5/2014 |

OTHER PUBLICATIONS

Kim, Woon-Yong and Kim, SoonGohn, The Design and Implementation of the Integrated Model of the Advertisement and Remote Control System for an Elevator, International Journal of Smart Home, vol. 8, No. 3, 2014, pp. 107-118.

PCT/US2015/066351, European Patent Office, International Search Report, dated Jul. 12, 2016.

PCT/US2015/066351, European Patent Office, Written Opinion of the International Searching Authority, dated Jul. 12, 2016.

* cited by examiner

SYSTEM AND METHOD OF MAINTAINING PERFORMANCE OF A SYSTEM

CROSS REFERENCE TO RELATED APPLICATIONS

The present application is related to, and claims the priority benefit of, International Patent Application PCT/US2015/066351 filed Dec. 17, 2015 and U.S. Provisional Patent Application Ser. No. 62/097,378 filed Dec. 29, 2014, the contents of which are hereby incorporated in their entirety into the present disclosure.

TECHNICAL FIELD OF THE DISCLOSED EMBODIMENTS

The presently disclosed embodiments generally relate to drive powered systems and more particularly, to a system and method of maintaining performance of a system.

BACKGROUND OF THE DISCLOSED EMBODIMENTS

Generally, commissioning of an elevator requires an installer to be physically present on-site to perform a manual operation to input values and parameters into the elevator drive. Additionally, the elevator drive includes a set of predetermined control parameters for electrical grid interface functions, and these parameters are rarely changed after the elevator drive is commissioned. However, over the life of the elevator system, conditions of the motor and electrical grid may change; thus causing the elevator system to perform at a less than optimal level. There is therefore a need for a system and method for monitoring changes within the motor and electrical grid of an elevator system, and automatically updating drive parameters based on said changes.

SUMMARY OF THE DISCLOSED EMBODIMENTS

In one aspect, a system is provided. In one embodiment, the system includes an elevator system. The elevator system includes a drive portion and an external computing device in communication with the drive portion. In one embodiment, the system further includes a motor and a load in communication with the drive portion. The external computing device is configured to receive operational data from the drive portion, determine operational parameters based at least in part on the operational data, determine whether the operational parameters are valid, and automatically transmit commands to the drive portion if the operational parameters are valid.

In one aspect, a method of maintaining operation of a system is provided. The method includes the step of transmitting operational data from the drive portion to the external computing device. In one embodiment, the operational data comprises at least one of motor values chosen from a group consisting of motor voltage, motor current, motor frequency, number of poles, motor rated speed, motor no-load current, motor slip, motor inductance, and motor resistance, and load values chosen from a group consisting of control line, inductance, line impedance, frequency, line voltage, line current, and resistance.

The method further includes the step of operating the external computing device to determine drive parameters based at least in part on the operational data; validate the determined operational parameter; transmit commands to the drive portion if the determined drive parameter values are validated.

In one embodiment, the commands include at least one of motor control parameters and load parameters. In one embodiment, if it is determined that the drive parameters are not valid, the method proceeds to the step of operating the external computing device to generate a fault status and transmit the fault status to the drive portion. In one embodiment, the operational data is received and the commands are transmitted continuously, or at a predetermined interval.

BRIEF DESCRIPTION OF THE DRAWINGS

The embodiments and other features, advantages and disclosures contained herein, and the manner of attaining them, will become apparent and the present disclosure will be better understood by reference to the following description of various exemplary embodiments of the present disclosure taken in conjunction with the accompanying drawings, wherein.

DETAILED DESCRIPTION OF THE DISCLOSED EMBODIMENTS

Figure 1:
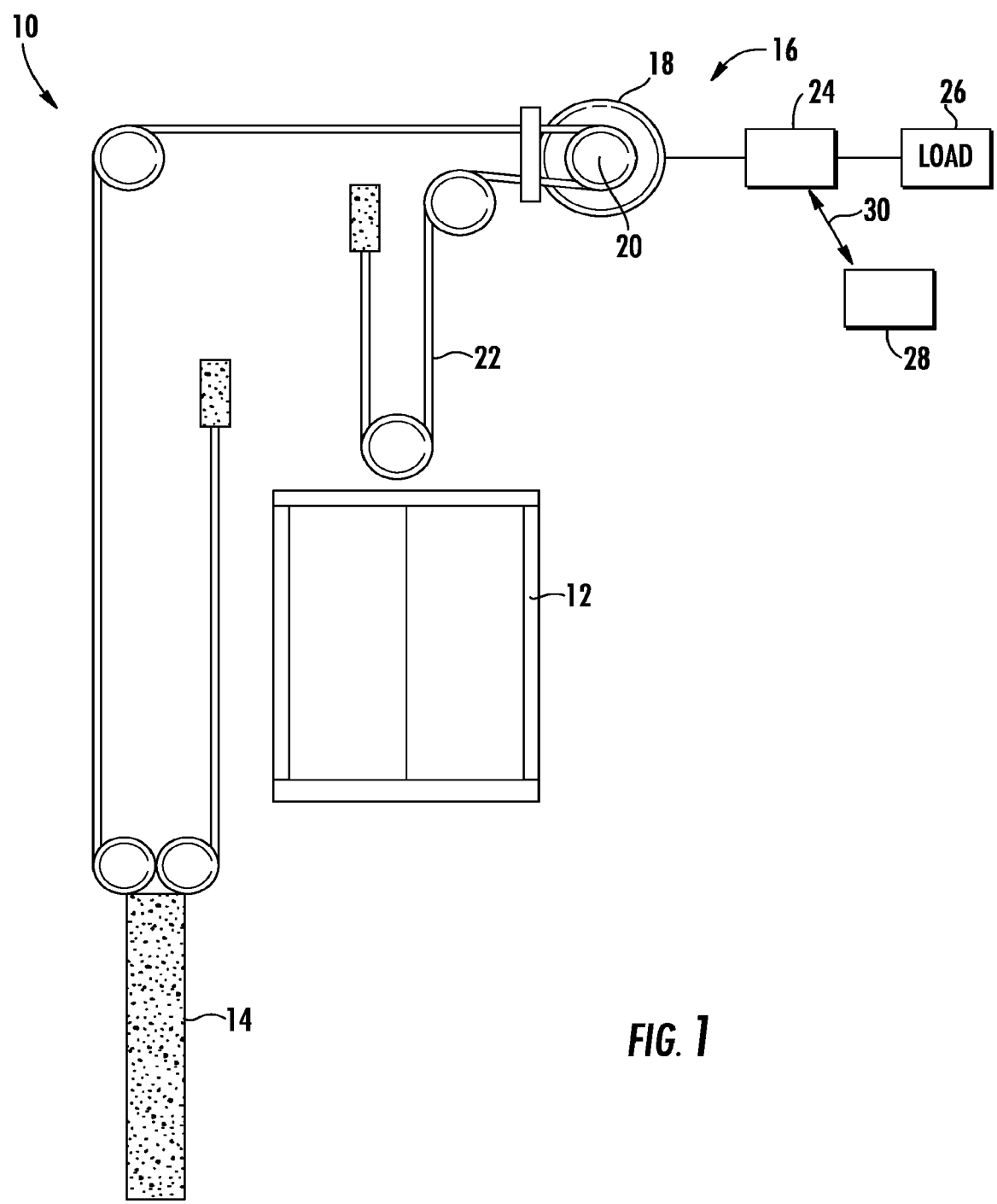
FIG. 1 illustrates a schematic drawing of an elevator system.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

FIG. 1 illustrates selected portions of system, generally indicated at 10. In the embodiment shown, the system 10 includes an elevator system. The elevator system 10 includes an elevator car 12 and counterweight 14. A roping arrangement 22 (e.g., round ropes or flat belts) supports the weight of the elevator car 12 and counterweight 14 in a known manner.

An elevator machine 16 includes a motor 18 associated with a traction sheave 20. The motor 18 selectively causes movement of the traction sheave 20 to cause corresponding movement of the roping arrangement 22 to control the position and movement of the elevator car 12 within a hoistway. When a motive force is required from the motor 18 for moving the traction sheave 20, the elevator machine 16 operates in a first mode in which it consumes electrical power. Under some operating conditions, the elevator car 12 can move without requiring a motive force from the motor 18.

Under some conditions, for example, the weight of the counterweight 14 can be relied upon to cause the elevator car 12 to rise within the hoistway as the counterweight 14 is allowed to descend. Releasing the brake of the elevator machine 16 and allowing the components of the motor 18 to rotate with the rotation of the traction sheave 20 under such conditions allows for the motor 18 to generate electrical power.

The example elevator machine 18 includes a drive portion 24 for providing electrical power to the motor 18 operating in the first mode and in some instances providing electrical power generated by the motor 18 to a load 26 when the motor 18 operates in the second mode. In one example, the load 26 comprises a power grid interface.

The drive portion 24 is also in communication with an external computing device 28. It will be appreciated that the external computing device 28 may include a server, an external CPU, laptop, and cloud-based server to name a few non-limiting examples. The external computing device 28 is configured to receive data from the drive portion 24 via communication line 30, determine elevator operational parameters based at least in part on the operational data received from the drive portion 24, and transmit commands to the drive portion 24 based at least in part on the elevator operational parameters via the communication line 30. It will be appreciated that the external computing device 28 may request operational data from the drive portion 24. It will also be appreciated that the drive portion 24 may be in communication with the external computing device 28 via a wired or wireless connection.

Figure 2:
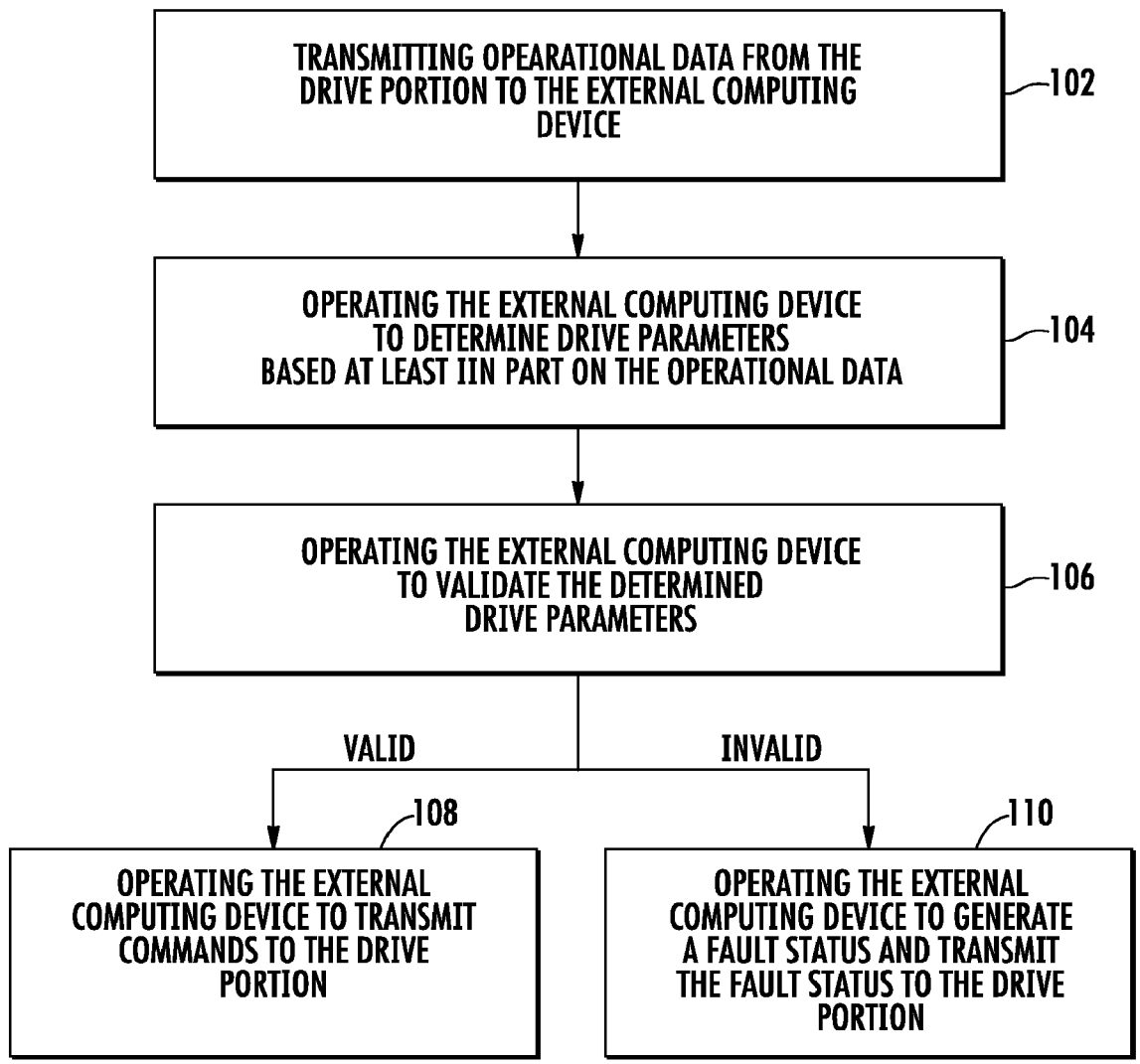
FIG. 2 illustrates a schematic flow diagram of a method maintaining the performance of an elevator system.

FIG. 2 illustrates a method, generally indicated at 100, of maintaining operation of a system 10. The method 100 includes the step 102 of transmitting operational data from the drive portion 24 to the external computing device 28. In one embodiment, the operational data comprises motor values from the motor 18. In one embodiment, the motor values are chosen from a group consisting of motor voltage, motor current, motor frequency, number of poles, motor rated speed, motor no-load current, motor slip, motor inductance, and motor resistance. For example, the elevator system 10 performs a first pre-defined sequence, such a single up-run or a single down run of the elevator car 12, to name a couple of non-limiting examples. While the elevator system 10 is operating in the pre-defined sequence, drive portion 24 may send the external computing device 28 one or more of the motor values as determined during the first pre-defined sequence, for example motor three-phase currents, D-axis current, Q-axis currents, motor speed, rotor position, motor drive three-phase pulse-width-modulation index, D-axis modulation index, Q-axis modulation index, and DC link voltage to name a few non-limiting examples, via communication line 30 to allow the external computing device 28 to determine the proper motor control parameters.

In one embodiment, the operational data comprises load values from the load 26. In one embodiment, the load values are chosen from a group consisting of control line, inductance, line impedance, frequency, line voltage, line current, and resistance. For example, the drive portion 24 may monitor and send the external computing device 28 one or more load values via communication line 30 to allow the external computing device 28 to determine the proper load parameters.

The method 100 further includes the step 104 of operating the external computing device 28 to determine drive parameters based at least in part on the operational data. For example, the external computing device 28 may receive or request a motor current value from the drive portion 24. As a further example, the external computing device 28 stores and processes the motor values using a system identification technique to estimate the elevator drive parameters, for example motor phase resistance, motor D-axis inductance, motor Q-axis inductance, and motor rotor resistance (in the case of induction motors), to name a few non-limiting examples, of a standard motor equivalent circuit model. Various optimization algorithms tune the estimated elevator drive parameter values of the motor equivalent circuit model, such that the difference between the model output and the operational data is minimized. In another example, the external computing device 28 may receive or request a line voltage value as measured by the drive portion 24 from the load 26. The external computing device 28 stores and processes the line voltage value, as described above, to determine the proper elevator drive parameter associated with line voltage.

The method 100 further includes the step 106 of operating the external computing device 28 to validate the determined drive parameter. For example, the elevator system 10 performs a second pre-defined sequence. The external computing device 28 receives the operational data from the second pre-defined sequence and performs a simulation of the second pre-defined sequence using the determined elevator drive parameters from step 104 and the simulated results of the second pre-defined sequence. The received operational data is compared to determined elevator drive parameters from step 104. If the calculated elevator drive parameters are within a pre-defined numerical threshold, then it is determined that the determined elevator drive parameter values are validated.

The method 100 further includes the step 108 of operating the external computing device 28 to transmit commands the drive portion 24 if the determined drive parameter values are validated. In one embodiment, the commands include motor control parameters. In one embodiment, the commands include load parameters. In one embodiment, if it is determined that the elevator drive parameters are not valid, the method proceeds to step 110 of operating the external computing device 28 to generate a fault status and transmit the fault status to the drive portion 24.

In one embodiment, the operational data is received and the commands are transmitted continuously. For example, the drive portion 24 may send operational data to the external computing device 28, or the external computing device 28 may request data from the drive portion 24, on a continuous basis based on the continuous operation of the elevator system 10. After each up or down run of the elevator system 10, the operational data is transferred to the external computing device 28, wherein the operational data is analyzed to determine whether the operational data contains sufficient information to determine elevator drive parameters. If sufficient data is present, the method proceeds from step 104 to calculate the elevator drive parameters based on the standard motor equivalent circuit model. In another embodiment, the data is received and the commands are transmitted at a predetermined interval. For example, the predetermined interval may be at approximately 10 minutes. It will be appreciated that the predetermined interval may be greater than or less than approximately 10 minutes. It will be appreciated that the method 100 is shown for use with an elevator system; however, the method 100 may be used for any system 10 containing a drive portion 24, a motor 18, and a load 26.

It will therefore be appreciated that use of present embodiments of a system 10 capable of sending operational data from an drive portion 24 to an external computing device 28, operating the external computing device 28 to determine drive parameters, and operating the external computing device 28 to automatically send commands back to the drive portion 24 for auto-tuning the system 10 to maintain proper operation.

While the invention has been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed is:

1. A system comprising:
   drive portion; and
   an external computing device in communication with the drive portion;
   wherein the external computing device is configured to:
   receive first operational data from the drive portion executing a first pre-defined sequence and second operational data from the drive portion executing a second pre-defined sequence,
   determine drive parameters based at least in part on the first operational data;
   determine whether the determined drive parameters are valid by performing a simulation of the second pre-defined sequence using the determined drive parameters; and
   automatically transmit commands to the drive portion if the determined drive parameters are valid.

2. The system of claim 1, further comprising a motor and a load in communication with the drive portion.

3. The system of claim 2, wherein the operational data comprises at least one of motor values and load values.

4. The system of claim 3, wherein the motor values are chosen from a group consisting of motor voltage constant, motor torque constant, motor resistance, motor inductance, motor inertia, and total inertia.

5. The system of claim 3, wherein the load values are chosen from a group consisting of control line, inductance, line impedance, frequency, voltage, current, and resistance.

6. The system of claim 3, wherein the commands comprise at least one of motor control parameters and load parameters.

7. The system of claim 1, wherein the operational data is received and the commands are transmitted continuously.

8. The system of claim 1, wherein the data is received and the commands are transmitted at predetermined intervals.

9. The system of claim 1, wherein the system comprises an elevator system.

10. A method of maintaining the operation of an system, the system comprising a drive portion in communication with an external computing device, a motor, and a load, the method comprising the steps of:
    transmitting first operational data and second operational data from the drive portion to the external computing device following executing a respective first pre-defined sequence and second pre-defined sequence;
    operating the external computing device to determine drive parameters based at least in part on the first operational data;
    operating the external computing device to validate the determined drive parameters by performing a simulation of the second pre-defined sequence using the determined drive parameters; and
    operating the external computing device to transmit commands to the drive portion if the determined drive parameters are valid.

11. The method of claim 10, further comprising:
    operating the external computing device to generate a fault status and transmit the fault status to the drive portion.

12. The method of claim 10, wherein the operational data comprises at least one of motor values and load values.

13. The method of claim 12, wherein the motor values are chosen from a group consisting of control line, inductance, line impedance, frequency, voltage, current, and resistance.

14. The method of claim 12, wherein the load values are chosen from a group consisting of control line, inductance, line impedance, frequency, voltage, current, and resistance.

15. The method of claim 12, wherein the commands comprise at least one of motor control parameters and load parameters.

16. The method of claim 10, wherein the operational data and the commands are transmitted continuously.

17. The method of claim 10, wherein the operational data and the commands are transmitted at predetermined intervals.

* * * * *